United States Patent
Liu et al.

(10) Patent No.: US 8,164,753 B2
(45) Date of Patent: Apr. 24, 2012

(54) ALIGNMENT MARK ARRANGEMENT AND ALIGNMENT MARK STRUCTURE

(75) Inventors: An-Hsiung Liu, Taoyuan (TW); Chun-Yen Huang, Taoyuan (TW); Ming-Hung Hsieh, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 360 days.

(21) Appl. No.: 12/478,778

(22) Filed: Jun. 5, 2009

(65) Prior Publication Data
US 2010/0309470 A1 Dec. 9, 2010

(51) Int. Cl.
*G01B 11/00* (2006.01)

(52) U.S. Cl. ..... 356/401; 257/797; 257/17; 257/E23.17; 257/179; 356/399

(58) Field of Classification Search ........... 257/797, 257/798, E23.17, E23.15, E23.179; 356/399, 356/401
See application file for complete search history.

(56) References Cited

U.S. PATENT DOCUMENTS

| 7,288,461 | B2 | 10/2007 | Chia | |
|---|---|---|---|---|
| 7,288,836 | B2* | 10/2007 | Chia et al. | 257/E23.179 |
| 2004/0137651 | A1* | 7/2004 | Smedt et al. | 438/16 |
| 2009/0032979 | A1* | 2/2009 | Nishikawa et al. | 257/797 |
| 2009/0225331 | A1* | 9/2009 | Van Haren | 356/614 |

FOREIGN PATENT DOCUMENTS

| JP | 2000252190 A | 9/2000 |
|---|---|---|
| JP | 2002075846 A | 3/2002 |
| JP | 2008211247 A | 9/2008 |
| JP | 2009038115 A | 2/2009 |

* cited by examiner

Primary Examiner — Gregory J Toatley
Assistant Examiner — Iyabo S Alli
(74) Attorney, Agent, or Firm — Winston Hsu; Scott Margo

(57) ABSTRACT

An alignment mark arrangement includes: a first alignment pattern comprising a plurality of parallel first stripes on a substrate, wherein each of the first stripes includes a first dimension; and a second alignment pattern positioned directly above and overlapping with the first alignment pattern, the second alignment pattern including a plurality of parallel second stripes, wherein each of the second stripes of the second alignment pattern has a second dimension that is larger than the first dimension of each of the first stripes of the first alignment pattern.

17 Claims, 3 Drawing Sheets

ALIGNMENT MARK ARRANGEMENT AND ALIGNMENT MARK STRUCTURE

BACKGROUND OF THE INVENTION

1. Field of the Invention

The present invention relates to an alignment mark arrangement and an alignment mark structure and, more particularly, to an alignment mark arrangement and structure which improves wafer alignment contrast.

2. Description of the Prior Art

To fabricate an integrated circuit on a semiconductor substrate such as a wafer, multiple layers of conductors and insulators are patterned and formed upon one another. In order for the devices to perform properly, each circuit pattern must be formed to be aligned as precisely as possible with the circuit pattern that has been previously formed on the wafer.

Typically, the alignment of layers is accomplished using a wafer stepper. The wafer stepper uses a laser beam with a fixed wavelength to sense the position of the alignment mark on the semiconductor wafer. The light from the laser beam is diffracted by the alignment marks, and the diffraction pattern is detected. The relative position of the wafer and the photomask is then adjusted accordingly.

The quality of the diffracted light from the alignment mark is directly related to the structure of the alignment mark, such as the material, the step height or the dimension of the mark.

However, as the wafer has undergone various processes of having circuit patterns formed thereon, the integrity of the alignment mark on the wafer is compromised. For example, the alignment mark may be damaged by abrasive polishing techniques such as chemical mechanical polishing, and the step height of the alignment mark may be reduced or destroyed. If polysilicon or metal silicide or metal layers, which are opaque or reflective, are formed thereon, the alignment mark will become undetectable. When the alignment mark has low reflectivity and insufficient step height, the mark is difficult to be detected. If additional layers are deposited on the mark, the reading of the mark is interfered with.

Various solutions to recover or repair damaged alignment marks have been proposed. For example, forming new alignment marks which do not overlap with the old alignment marks, or forming a mask on the alignment marks to protect the alignment marks from being polished.

However, the solutions mentioned above are time consuming and waste space. Therefore, it would be desirable to reduce the wasted space on the semiconductor wafer and to increase the image contrast of the alignment mark.

SUMMARY OF THE INVENTION

The present invention provides a novel solution to improve the alignment contrast and accuracy.

According to one aspect of the present invention, an alignment mark arrangement includes: a first alignment pattern comprising a plurality of parallel first stripes on a substrate, wherein each of the first stripes comprises a reflective layer and a first dimension; and a second alignment pattern positioned directly above and overlapping with the first alignment pattern, the second alignment pattern comprising a plurality of parallel second stripes, wherein each of the second stripes of the second alignment pattern has a second dimension that is larger than the first dimension of each of the first stripes of the first alignment pattern.

According to another aspect of the present invention, an alignment mark structure includes: a first reflective layer positioned on a substrate; a transparent layer on the reflective layer; and an alignment pattern positioned on the transparent layer.

The alignment marks in the present invention have a special arrangement: the dimension of the alignment pattern in the previous layer is smaller that that of the alignment pattern in the current layer. Furthermore, the step height of the alignment pattern in the current layer is defined by the surface of the alignment pattern in the current layer and a surface of a reflective layer on a substrate upon which the alignment pattern of the previous layer is positioned.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
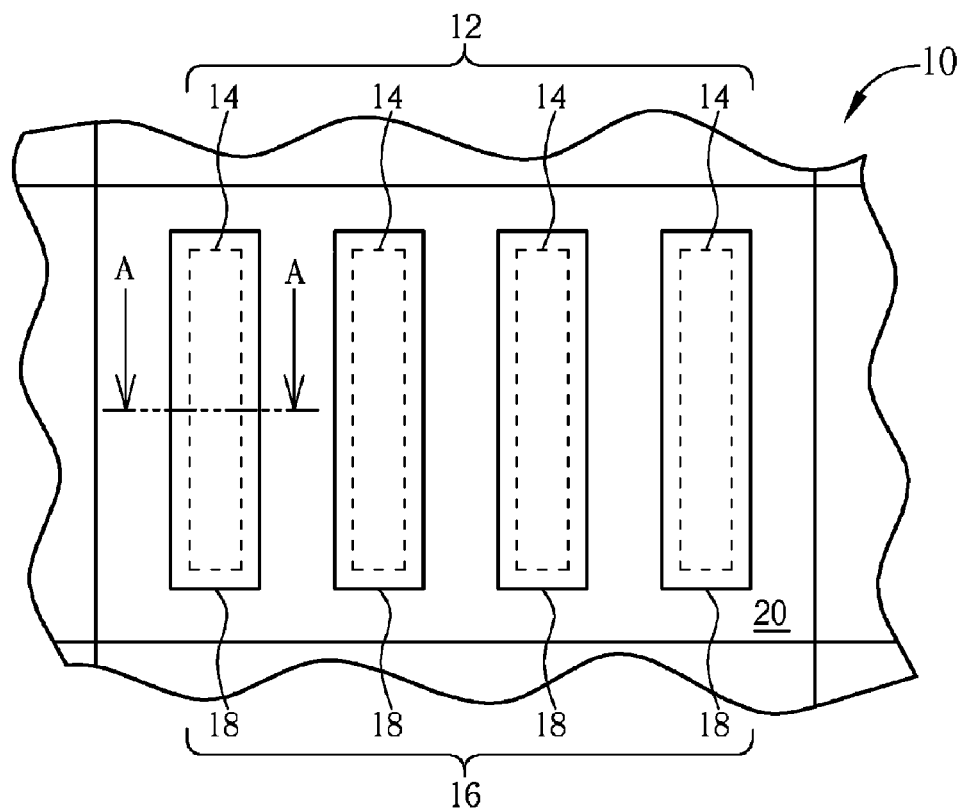
FIG. 1 schematically depicts a top view of an alignment mark arrangement.
Figure 2:
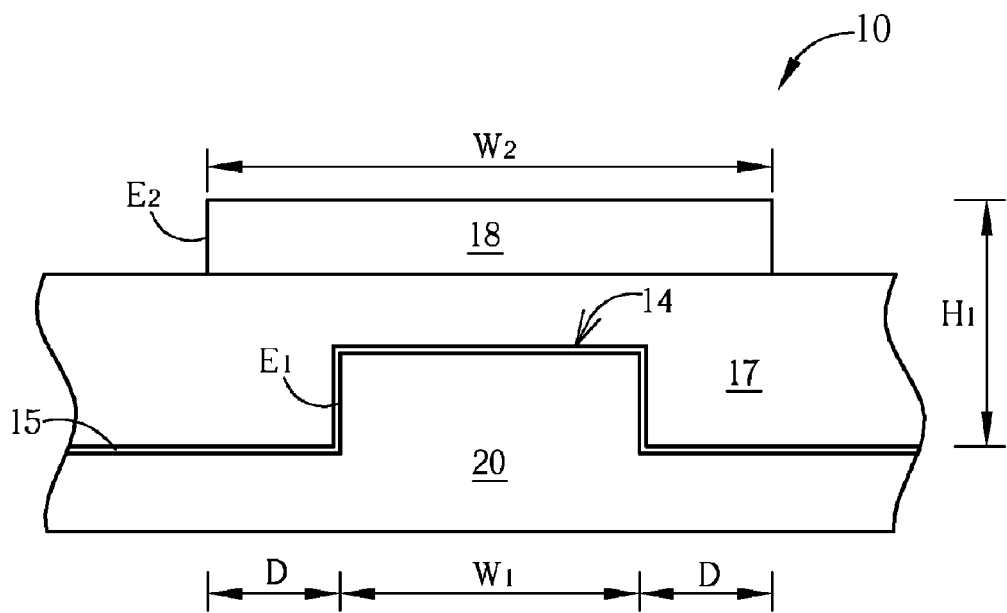
FIG. 2 schematically depicts a side view of the alignment mark arrangement taken along line A-A in FIG. 1 according to a first embodiment of present invention.

FIG. 1 schematically depicts a top view of an alignment mark arrangement. FIG. 2 schematically depicts a sectional view of the alignment mark arrangement taken along line A-A in FIG. 1 according to a first embodiment of present invention. As shown in FIG. 1 and FIG. 2, an alignment mark arrangement 10 includes a first alignment pattern 12 comprising a plurality of parallel first stripes 14 positioned on a substrate 20. Each of the first stripes includes a first dimension. The first alignment pattern 12 and the first stripes 14 are indicated by dashed lines in FIG. 1.

A second alignment pattern 16 is positioned directly above and overlaps with the first alignment pattern 12. The second alignment pattern 16 includes a plurality of parallel second stripes 18. It is noteworthy that each of the second stripes 18 of the second alignment pattern 16 has a second dimension that is larger than the first dimension of the first stripes 14 of the first alignment pattern 12. According to the first preferred embodiment of the present invention, the first and second dimensions refer to the widths of each of the first stripes 14 and each of the second stripes 18, respectively. Furthermore, each of the first stripes 14 is covered by one of the second stripes 18.

In the first preferred embodiment, each of the first stripes 14 and each of the second stripes 18 are rectangular. To illustrate the first stripes 14 and the second stripes 18 more specifically, please refer to FIG. 2. In FIG. 2, only one of the first stripes 14 of the first alignment pattern 12 and one of the second stripes 18 of the second alignment pattern 16 are depicted. Other first stripes 14 and second stripes 18 are omitted for the sake of simplicity. It is understood that the first alignment pattern 12 is formed by repeating the single first stripe 14 illustrated in FIG. 2, and the second alignment pattern 16 is formed by repeating the single second stripe 18 illustrated in FIG. 2.

As shown in FIG. 2, the first stripe 14 is positioned on the substrate 20. The first stripe 14 is preferably a rectangular protrusion on the substrate 20. The first stripe 14 is covered with a reflective layer 15, and the reflective layer 15 extends from the first stripe 14 to the surface of the substrate 20. Moreover, the reflective layer 15 is made of at least one material selected from the group consisting of polysilicon, metals, carbon, metal silicide and silicon nitride.

A material layer 17, which is substantially transparent, is disposed on the reflective layer 15. The material layer 17 may be any materials which allow light such as a laser beam emitted from a detector to pass through. The material layer 17 is preferably silicon oxide. The second stripe 18 is positioned on the material layer 17, and the second stripe 18 is also preferably a rectangular protrusion comprising a reflective material. For example, the second stripe 18 is made of the material selected from the group consisting of polysilicon, metals, carbon, metal silicide and silicon nitride.

The first stripe 14 has a first width $W_1$, and the second stripe 18 has a second width $W_2$. The second width $W_2$ is greater than the first width $W_1$. In this embodiment, the second width $W_2$ is greater than the summation of the first width $W_1$ and the thickness of the reflective layer 15 as well. Furthermore, the first stripe 14 has a first edge $E_1$ and the second stripe 18 has a second edge $E_2$, and the first edge $E_1$ is distant from the second edge $E_2$.

An distance D is between the first edge $E_1$ and the second edge $E_2$. In other words, the first edge $E_1$ and the second edge $E_2$ are separate from the distance D. Furthermore, the second stripe 18 is directly above the first stripe 14 and completely overlaps with the first stripe 14 in the widthways direction. Moreover, the distance D is preferably not less than 200 nm in order to provide as large a process window as possible. In a preferred embodiment, the first width $W_1$ is 1.2 μm, and the second width $W_2$ is 1.6 μm. Consequently, when performing the alignment process, the surface of the second stripe 18 and the reflective layer 15 on the substrate 20 are exposed to the light emitted from a detector (not shown) of a stepper, a step height $H_1$ between the surface of the second stripe 18 and the surface of the reflective layer 15 on the substrate 20 is detected, and the alignment contrast is improved during the process. The reason why the second width $W_2$ needs to be greater than the first width $W_1$ is to prevent the light emitted from a detector from being interfered with by the topography of the first stripe 14.

Although the first stripe 14 is exemplified as a rectangular protrusion in the above embodiment, the first stripe 14 can be a trench pattern formed in the substrate 20 in other cases.

Figure 3:
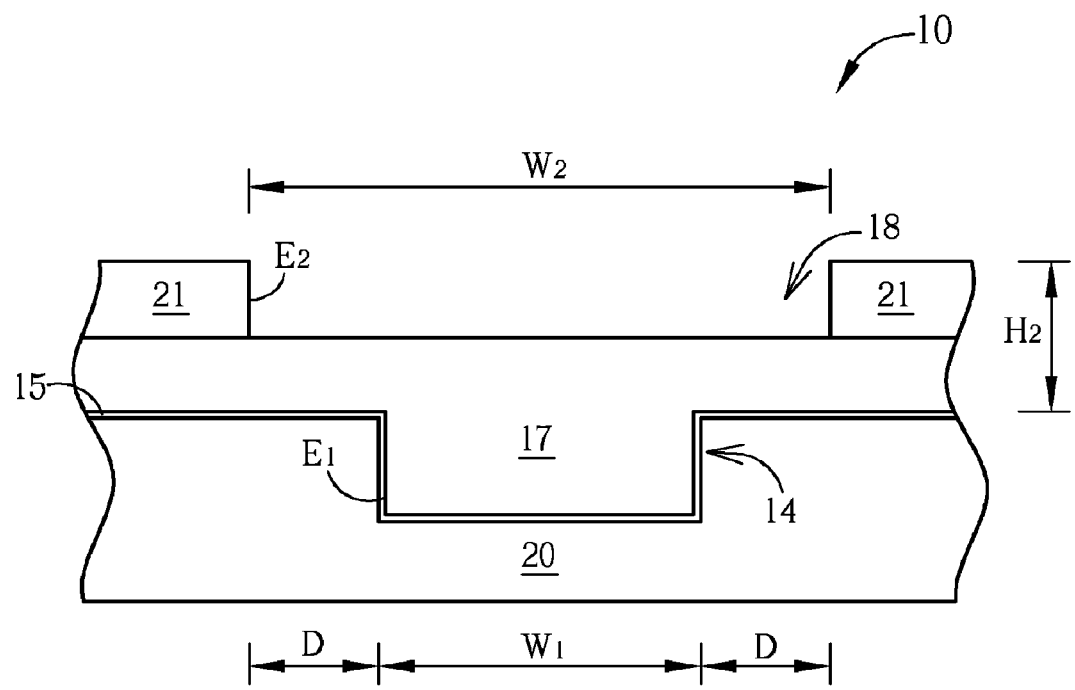
FIG. 3 schematically depicts a side view of the alignment mark arrangement taken along line A-A in FIG. 1 according to a second embodiment of present invention.

FIG. 3 schematically depicts a sectional view of the alignment mark arrangement taken along line A-A in FIG. 1 according to a second embodiment of the present invention. Similarly, only one of the first stripes 14 of the first alignment pattern 12 and one of the second stripes 18 of the second alignment pattern 16 are depicted. The other first stripes 14 and second stripes 18 are omitted for the sake of simplicity. It is understood that the first alignment pattern 12 is formed by repeating the single first stripe 14 illustrated in FIG. 3, and the second alignment pattern 16 is formed by repeating the single second stripe 18 illustrated in FIG. 3. The primary difference between the first embodiment and the second embodiment is that the first stripe 14 and the second stripe 18 in the second preferred embodiment are trench patterns rather than rectangular protrusions.

As shown in FIG. 3, the first stripe 14 is a recessed trench pattern that is etched into the substrate 20. The first stripe 14 is covered with a reflective layer 15, and the reflective layer 15 extends from the first stripe 14 to the surface of the substrate 20 outside the first stripe 14. A material layer 17, which is substantially transparent, is disposed on the first stripe 14 and on the reflective layer 15. Preferably, the material layer 17 is silicon oxide. A material layer 21 is positioned on the material layer 17. The second stripe 18 is a trench pattern formed in the material layer 21, and the material layer 17 is exposed through the second stripe 18. The material layer 21 is made of a material with reflective characteristics such as polysilicon, metals, carbon, metal silicide or silicon nitride. The first stripe 14 has a first width $W_1$, and the second stripe 18 has a second width $W_2$. The second width $W_2$ is greater than the first width $W_1$. Furthermore, the first stripe 14 has a first edge $E_1$ and the second stripe 18 has a second edge $E_2$, and the first edge $E_1$ is distant from the second edge $E_2$. An distance D is between the first edge $E_1$ and the second edge $E_2$. In other words, the first edge $E_1$ and the second edge $E_2$ are separate from the distance D. Moreover, the distance D is preferably not less than 200 nm in order to provide a sufficient size of process window. In this preferred embodiment, the first width $W_1$ is 1.2 μm, and the second width $W_2$ is 1.6 μm. Consequently, when performing the alignment process, the surface of the material layer 21 and the reflective layer 15 on the substrate 20 are exposed to the light emitted from a detector (not shown) of a stepper so a step height $H_2$ between the surface of the material layer 21 and the surface of the reflective layer 15 on the substrate 20 is detected, and the alignment contrast is improved during the process. Although the first stripe 14 is exemplified as a trench pattern formed in the substrate 20, the first stripe 14 can be a rectangular protrusion on the substrate 20 in another case.

Figure 4:
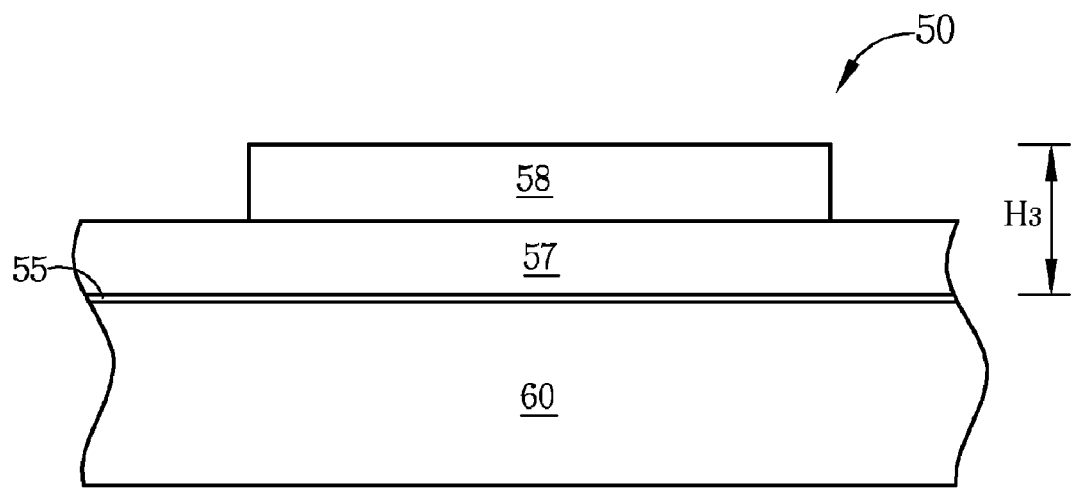
FIG. 4 schematically depicts a sectional view of the alignment mark structure according to a third preferred embodiment of present invention.

FIG. 4 schematically depicts a sectional view of an alignment mark structure according to a third preferred embodiment of the present invention. As shown in FIG. 4, the alignment mark structure 50 is formed on a substrate 60 with a reflective layer 55 thereon. A transparent layer 57 is positioned on the reflective layer 55. An alignment pattern comprising at least one rectangular protrusion 58 is positioned on the transparent layer 57. The alignment pattern can be formed by repeating the rectangular protrusion 58 illustrated in FIG. 4. The reflective layer 55 is made of at least one material selected from the group consisting of polysilicon, metals, carbon, metal silicide and silicon nitride. The transparent layer 57 may be any materials which allow light such as a laser beam emitted from a detector to pass through. Preferably, the transparent layer 57 is silicon oxide. The rectangular protrusion 58 is of a reflective characteristic, which means the rectangular protrusion 58 can reflect the laser beam from the detector. Under some circumstances, the edge of the rectangular protrusion 58 can diffract the laser beam.

During the alignment process, the rectangular protrusion 58 and the reflective layer 55 on the substrate 60 are exposed to the light emitted from a detector (not shown) of a stepper so a step height $H_3$ between the surface of the rectangular protrusion 58 and the surface of the reflective layer 55 on the substrate 60 is detected, and the alignment contrast is improved.

Figure 5:
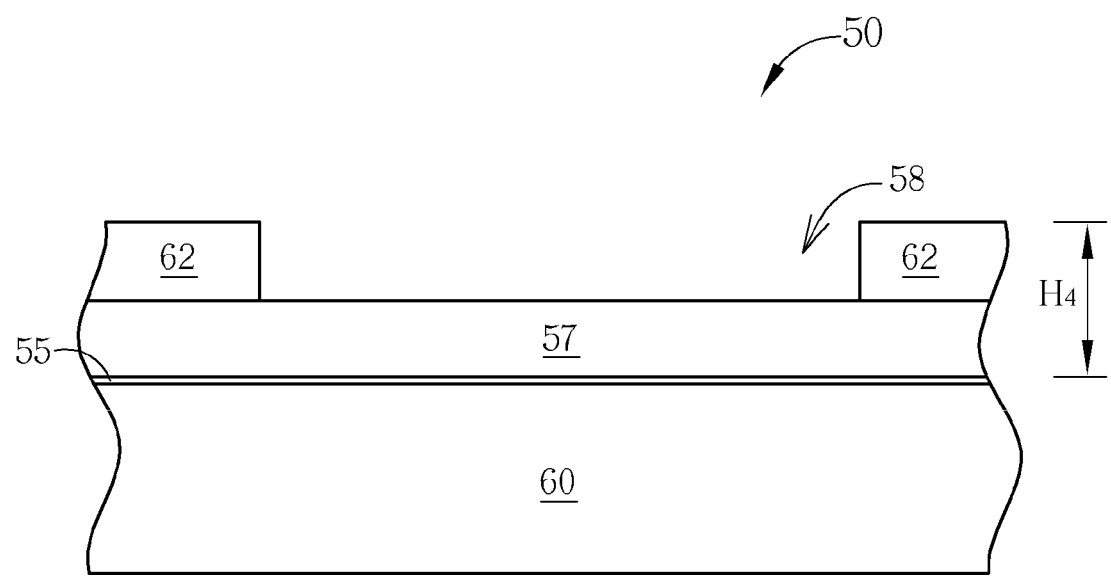
FIG. 5 schematically depicts a sectional view of the alignment mark structure according to a fourth preferred embodiment of present invention.

FIG. 5 schematically depicts a sectional view of the alignment mark structure according to a fourth preferred embodiment of the present invention. The difference between the fourth preferred embodiment and the third preferred embodiment is that the alignment pattern includes a plurality of trench patterns instead of the rectangular protrusions in the third embodiment. Materials having similar properties in FIG. 5 will be designated with the same numeral numbers as in FIG. 4. Please refer to FIG. 4 for the details. As shown in FIG. 5, a reflective layer 62 is positioned on the transparent layer 57. The reflective layer 62 is made of at least one material selected from the group consisting of polysilicon, metals, carbon, metal silicide and silicon nitride. An alignment pattern comprising at least one trench pattern 58 is formed in a reflective layer 62 on the transparent layer 57. The alignment pattern can be formed by repeating the trench pattern 58 shown in FIG. 5.

During the alignment process, the surface of the reflective layer 62 and the reflective layer 55 on the substrate 60 are exposed to the light emitted from a detector (not shown) of a stepper, and a step height $H_4$ between the surface of the reflective layer 62 and the surface of the reflective layer 55 on the substrate 60 is detected so as to improve the alignment contrast during the alignment process.

According to the first and second embodiment of the present invention, the width of the first alignment pattern is smaller that that of the second alignment pattern. In this way, the step height between the surface of the second alignment pattern and the reflective layer on the substrate may be detected by a detector. Furthermore, the light emitted from a detector will not be interfered with by the topography of the first alignment pattern.

According to the third and fourth embodiment of the present invention, there is only one alignment pattern on the current layer. The alignment pattern in the previous layer is optional. The step height between the alignment pattern and the reflective layer on the substrate can be detected by a detector, and the alignment contrast can be improved.

Those skilled in the art will readily observe that numerous modifications and alterations of the device and method may be made while retaining the teachings of the invention.

What is claimed is:

1. An alignment mark arrangement, comprising:
   a first alignment pattern comprising a plurality of parallel first stripes on a substrate, wherein each of the first stripes comprises a first dimension; and
   a second alignment pattern positioned directly above and overlapping the first alignment pattern, the second alignment pattern comprising a plurality of parallel second stripes, wherein each of the second stripes of the second alignment pattern has a second dimension that is larger than the first dimension of each of the first stripes of the first alignment pattern, and each of the first stripes is covered by one of the second stripes.

2. The arrangement of claim 1, wherein each of the first stripes and each of the second stripes are rectangular.

3. The arrangement of claim 2, wherein each of the first stripes comprises a first width, and each of the second stripes comprises a second width that is greater than the first width.

4. The arrangement of claim 3, wherein the first width is 1.2 µm, and the second width is 1.6 µm.

5. The arrangement of claim 2, wherein each of the second stripes has a second edge and each of the first stripes has a first edge distant from the second edge.

6. The arrangement of claim 5, wherein the first edge and the second edge are separate from a distance not less that 200 nm.

7. The arrangement of claim 1, wherein the second stripes comprise a reflective material.

8. The arrangement of claim 7, wherein the reflective material is selected from the group consisting of polysilicon, metals, carbon, metal silicide and silicon nitride.

9. The arrangement of claim 1, wherein the second stripes are formed directly on a first material layer.

10. The arrangement of claim 9, wherein each of the second stripes is a trench pattern formed in a second material layer on the first material layer.

11. The arrangement of claim 9, wherein the first material layer is substantially transparent.

12. The arrangement of claim 11, wherein the second stripes are protrusions formed on the first material layer.

13. The arrangement of claim 1, wherein each of the first stripes is covered by a reflective layer and the reflective layer extends to a surface of the substrate.

14. The arrangement of claim 13, wherein when performing an alignment process, each of the second stripes and the reflective layer are exposed to a light emitted from a detector, and a step height between the reflective layer on the surface of the substrate and a surface of each of the second stripes is detected so as to improve the alignment contrast during the alignment process.

15. The arrangement of claim 13, wherein the reflective layer is made of at least one material selected from the group consisting of polysilicon, metals, carbon, metal silicide and silicon nitride.

16. The arrangement of claim 1, wherein a transparent layer is positioned between the second alignment pattern and the first alignment pattern.

17. The arrangement of claim 16, wherein the transparent layer comprises silicon oxide.

* * * * *